United States Patent
Sun

(10) Patent No.: US 7,009,226 B1
(45) Date of Patent: Mar. 7, 2006

(54) IN-SITU NITRIDE/OXYNITRIDE PROCESSING WITH REDUCED DEPOSITION SURFACE PATTERN SENSITIVITY

(75) Inventor: Sey-Ping Sun, Fishkill, NY (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/887,836

(22) Filed: Jul. 12, 2004

(51) Int. Cl.
 *H01L 29/78* (2006.01)
(52) U.S. Cl. .................. 257/192; 257/382; 257/442; 257/616; 257/649; 257/900
(58) Field of Classification Search .............. 257/192, 257/616, 649, 900
See application file for complete search history.

(56) References Cited

U.S. PATENT DOCUMENTS

| | | | | |
|---|---|---|---|---|
| 6,124,217 A | * | 9/2000 | Sun et al. | 438/778 |
| 6,316,820 B1 | * | 11/2001 | Schmitz et al. | 257/649 |
| 6,509,587 B1 | * | 1/2003 | Sugiyama et al. | 257/192 |
| 6,690,043 B1 | * | 2/2004 | Usuda et al. | 257/194 |
| 6,709,935 B1 | | 3/2004 | Yu | |
| 6,787,864 B1 | * | 9/2004 | Paton et al. | 257/412 |
| 6,946,371 B1 | | 9/2005 | Langdo et al. | |

OTHER PUBLICATIONS

S.E. Thompson et al., "A Logic Nanotechnology Featuring Strained-Silicon", IEEE Electron Device Letters, IEEE Inc. New York, US, vol. 25, No. 4, Apr. 2004, pp. 191-193, XP001190370.
T. Ghani et al., "A 90nm High volume Manufacturing Logic Technology Featuring Novel 45nin Gate Length Strained Silicon CMOS Transistors" International Electron Devices Meeting 2003, IEDM, Technical Digest, Washington DC, Dec. 8, 2003, pp. 978-980, XP010884238.
S. Thompson et al., "90nm Logic TechnologyFeaturing 50nm Strained Silicon Channel Transistors, 7 layers of Cu Interconnects, Low K ILD, and 1/spl mu/m<2>, SRAM Cell", International Electron Devices Meeting 2002. IEDM Technical Digest, San Francisco, CA, Dec. 8-11, 2002, New York, NY: IEEE, US, Dec. 8, 2002, pp. 61-64, XP010625990.

* cited by examiner

*Primary Examiner*—Gene M. Munson

(57) ABSTRACT

Carrier mobility in transistor channel regions is increased by depositing a conformal stressed liner. Embodiments include forming a silicon oxynitride layer on the stressed liner to reduce or eliminate deposition surface pattern sensitivity during gap filling, and in-situ SACVD of silicon oxide gap fill directly on the stressed liner with reduced pattern sensitivity. Embodiments also include the use of Si—Ge substrates.

9 Claims, 5 Drawing Sheets

IN-SITU NITRIDE/OXYNITRIDE PROCESSING WITH REDUCED DEPOSITION SURFACE PATTERN SENSITIVITY

FIELD OF THE INVENTION

The present invention relates to the fabrication microminiaturized semiconductor devices comprising transistors exhibition enhanced channel carrier mobility. The present invention is particularly applicable in fabricating high speed transistors efficient, simplified methodology with reduced or no deposition surface pattern sensitivity during gap fill deposition.

BACKGROUND OF THE INVENTION

The relentless pursuit of miniaturized, high speed semiconductor devices continues to challenge the limitations of conventional semiconductor materials and fabrication techniques. Conventional semiconductor devices typically comprise a plurality of active devices in or on a common semiconductor substrate, e.g., CMOS devices comprising at least a pair of PMOS and NMOS transistors in spaced adjacency. Current technology utilizes crystalline semiconductor wafers as substrates, such as a lightly p-doped epitaxial ("epi") layer of silicon (Si) grown on a heavily-doped, crystalline Si Substrate. The low resistance of the heavily-doped substrate is necessary for minimizing susceptibility to latch-up, whereas the light doping of the epi layer permits independent tailoring of the doping profiles of both the p-type and n-type wells formed therein as part of the fabrication sequence, thereby resulting in optimal PMOS and NMOS transistor performance.

The use of the very thin epi layers, i.e., several $\mu$m thick, is made possible by utilizing shallow trench isolation ("STI"), which advantageously minimizes up-diffusion of p-type dopant(s) from the more heavily-doped substrate into the lightly-doped epi layer. In addition, STI allows for closer spacing of adjacent active areas by avoiding the "bird's beak" formed at the edge of each LOCOS isolation structure. STI also provides better isolation by creating a more abrupt structure, reduces the vertical step from active area to isolation to improve gate lithography control, eliminates the high temperature field oxidation step that can cause problems with large diameter, i.e., 8 inch, wafers, and is scalable to future logic technology generations.

Substrates based on "strained silicon" have attracted interest as a semiconductor material which provides increased speeds of electron and hole flow therethrough, thereby permitting fabrication of semiconductor devices with higher operating speeds, enhanced performance characteristics, and lower power consumption. A very thin, tensilely strained, crystalline silicon (Si) layer is grown on a relaxed, graded composition of silicon-germanium (Si—Ge) buffer layer several microns thick, which Si—Ge buffer layer in turn is formed on a suitable crystalline substrate, e.g., a Si wafer or a silicon-on-insulator (SOI) wafer. The Si—Ge buffer layer typically contains 12 to 25 at. % Ge. Strained Si technology is based upon the tendency of the Si atoms, when deposited on the Si—Ge buffer layer, to align with the greater lattice constant (spacing) of Si and Ge atoms therein (relative to pure Si). As a consequence of the Si atoms being deposited on a substrate (Si—Ge) comprised of atoms which are spaced further apart, they "stretch" to align with the underlying Si and Ge atoms, thereby "stretching" or tensilely straining the deposited Si layer. Electrons and holes in such strained Si layers have greater mobility than in conventional, relaxed Si layers with smaller inter-atom spacings, i.e., there is less resistance to electron and/or hole flow. For example, electron flow in strained Si may be up to about 70% faster compared to electron flow in conventional Si. Transistors and IC devices formed with such strained Si layers can exhibit operating speeds up to about 35% faster than those of equivalent devices formed with conventional Si, without necessity for reduction in transistor size.

The mobility of electrons is faster than the mobility of holes in conventional bulk silicon substrates. Accordingly, in conventional CMOS transistors, the drive current of the PMOS transistor is less than the drive current of the NMOS transistor creating an imbalance. This imbalance is exacerbated in CMOS transistors fabricated on or within a tensilely stressed active device area formed in a strained lattice semiconductor substrate, e.g., strained Si on Si—Ge, because the increase in electron mobility is greater than the increase in hole mobility.

Conventional practices used to fabricate various types of semiconductor devices comprise depositing a dielectric layer, such as a interlayer dielectric, as by subatmospheric chemical vapor deposition (SACVD), e.g., silicon oxide derived from tetraethyl orthosilicate (TEOS). However, due to a reverse loading effect, the oxide film is deposited in isolated areas at a thickness less than in dense areas. Thus, there is an undesirable thickness dependence of the deposited dielectric layer upon the surface patterns during gap filling. As micro-miniaturization proceeds, there is an attendant need to increase the drive current of transistors, including transistors formed on strained Si/Si—Ge substrates, by enhancing carrier mobility.

Accordingly, there exists a need for efficient methodology enabling the fabrication of semiconductor devices with enhanced drive currents by increasing channel carrier mobility, and for efficient methodology enabling the deposition of dielectric layers with no or significantly reduced deposition surface pattern sensitivity during gap filling.

DISCLOSURE OF THE INVENTION

An advantage of the present invention is a method of fabricating a semiconductor device comprising transistors with enhanced drive currents.

Another advantage of the present invention is a method of fabricating a semiconductor device with reduced oxide deposition surface pattern sensitivity.

Another advantage of the present invention is a semiconductor device comprising transistors with enhanced drive currents.

Additional advantages and other aspects and features of the present invention will be set forth in the description which follows and in part will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are obtained in part by a semiconductor device comprising: A substrate; a plurality of transistors formed on the substrate, each transistor comprising source/drain regions and a gate electrode, having an upper surface and side surfaces, over the substrate with a gate dielectric layer therebetween, the gate electrodes being separated by a gap; a stressed nitride liner over the upper and side surfaces of the gate electrodes and over the source/drain regions; a conformal silicon oxynitride layer on the stressed nitride liner; and a dielectric layer over the transistors filling the gaps between the gate electrodes.

Another advantage of the present invention is a method of manufacturing a semiconductor device, the method comprising: forming a plurality of transistors on a substrate, each transistor comprising source/drain regions and a gate electrode, having an upper surface and side surfaces, over the substrate with a gate dielectric layer therebetween, the gate electrodes being separated by gaps; forming a stressed nitride liner over the upper and side surfaces of the gate electrodes and over the source/drain regions; forming a conformal silicon oxynitride layer on the stressed nitride liner; and depositing a dielectric layer over the transistors filling the gaps between the gate electrodes.

Embodiments of the present invention comprise semiconductor devices based on strained Si/Si—Ge substrates. Embodiments of the present invention include forming dielectric sidewall spacers on the side surfaces of the gate electrodes, forming a layer of metal silicide, e.g., nickel silicide, on the upper surface of the gate electrodes and on the source/drain regions, and depositing the stressed nitride liner, which is conformal, on the sidewall spacers and on the metal silicide layers.

Embodiments of the present invention include depositing the stressed conformal nitride liner by PECVD at a temperature of about 350° C. to about 550° C., to a thickness of about 200 Å to about 1,000 Å, e.g., about 200 Å to about 300 Å, and then, in the presence of nitrous oxide ($N_2O$) plasma, to convert in-situ an upper surface portion of the stressed conformal nitride liner, e.g., silicon nitride, to the conformal silicon oxynitride layer at a thickness of about 20 Å to about 40 Å, and then depositing silicon oxide as the dielectric layer by SACVD filling the gaps at a thickness of about 4,500 Å to about 7,500 Å. In other embodiments of the present invention, the stressed conformal nitride liner, e.g., silicon nitride, can be deposited by SACVD followed by in-situ SACVD silicon oxide for gap filling.

Additional advantages and aspects of the present invention will become readily apparent to those skilled in the art from the following detailed description, wherein embodiments of the present invention are shown and described, simply by way of illustration of the best mode contemplated for practicing the present invention. As will be described, the present invention is capable of other and different embodiments, and its several details are susceptible of modification in various obvious respects, all without departing from the spirit of the present invention. Accordingly, the drawings and description are to be regarded as illustrative in nature, and not as limitative.

BRIEF DESCRIPTION OF THE DRAWINGS

In FIGS. 1 through 5, similar features are denoted by similar reference characters.

DESCRIPTION OF THE INVENTION

Figure 1:
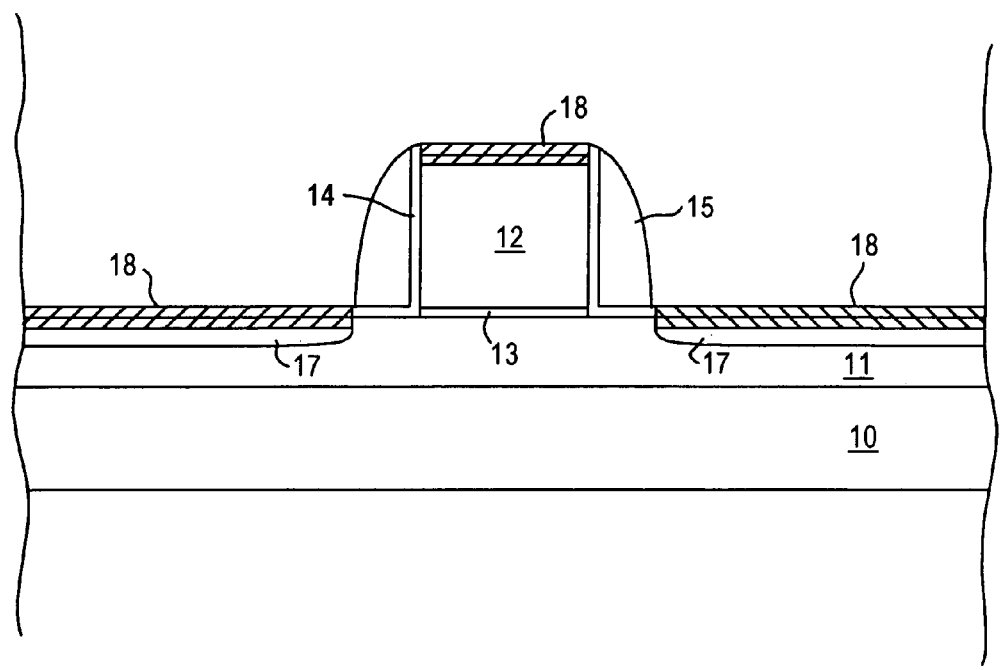
FIGS. 1 through 5 schematically illustrate sequential phases of a method in accordance with an embodiment of the present invention.

The present invention addresses and solves the problem of increasing the drive current of transistors, including transistors based on strained Si/Si—Ge substrates, in a cost effective and efficient manner by significantly enhancing channel carrier mobility. The present invention also addresses and solves the loading problem wherein the thickness of a deposited dielectric layer depends upon differences between topographical features, as between closely spaced gate electrodes and isolated electrodes. The present invention stems in part, from the recognition that the channel carrier mobility of transistors, particularly transistors based on strained Si/Si—Ge substrates, can be increased by applying a stress thereto. The present invention also stems, in part, from the recognition that the surface pattern sensitivity of a dielectric layer during deposition, as when depositing silicon oxide layer by SACVD, can be eliminated or significantly reduced by forming a transition layer of silicon oxynitride on the stressed nitride liner, as by reacting in the presence of $N_2O$ plasma, or in-situ SACVD processing, thereby reducing the SACVD oxide surface pattern sensitivity.

The exact mechanism by which the formation of a conformal silicon oxynitride transition layer eliminates or significantly reduces surface pattern sensitivity during deposition of the gap fill dielectric is not known with certainty. However, it is believed that the formation of a thin, conformal transition silicon oxynitride layer acts as a buffer to offset the reverse loading effect by PECVD means. It was also found that the conformal transition silicon oxynitride layer may be omitted by employing in-situ SACVD silicon oxide gap filling, thereby reducing pattern sensitivity.

In forming P-channel transistors, channel carrier mobility is enhanced by applying a stressed dielectric layer exhibiting high compressive stress for increased hole mobility. In N-channel transistors, channel carrier mobility is significantly increased by applying a stressed layer exhibiting high tensile stress for increased electron mobility. Embodiments of the present invention include depositing a stressed nitride layer on transistors formed on strained Si/Si—Ge substrates, wherein the source/drain regions are formed within the strained Si layer. The stressed nitride liner may comprise silicon nitride and may be deposited by SACVD or PECVD, at a thickness of about 200 Å to about 1,000 Å, e.g., about 200 Å to about 300 Å. Conventional PECVD conditions may be employed for deposition of a highly compressive or highly tensile dielectric layer. In depositing a stressed nitride liner exhibiting high compressive stress, both high frequency and low frequency power are applied. When depositing a stressed nitride liner exhibiting high tensile stress, the low frequency power is significantly reduced.

For example, a stressed conformal silicon nitride layer exhibiting a high compressive stress, e.g., greater than 1 GPa, may be deposited at: a silane ($SiH_4$) flow rate of 200 to 500 sccm; a nitrogen ($N_2$) flow rate of 2,000 to 10,000 sccm; an ammonia ($NH_3$) flow rate of 2,500 to 5,000 sccm; a $SiH_4/NH_3$ ratio of 0.2 to 0.04, a temperature of 350° C. to 550° C.; a pressure of 1 to 5 Torr; a high frequency RF power of 70 to 300 watts; and a low frequency RF power of 20 to 60 watts. A stressed silicon nitride layer exhibiting a high tensile stress e.g., greater than 1 GPa, may be deposited at: a $SiH_4$ flow rate of 50 to 500 sccm; an $NH_3$ flow rate of 1,500 to 5,000 sccm; a $N_2$ flow rate of 4,000 to 30,000 sccm; a $SiH_4/NH_3$ ratio of 0.2 to 0.04, a temperature of 350° C. to 550° C.; a pressure of 2 to 10 Torr; a high frequency power of 40 to 300 watts; and a low frequency power of 0 to 10 watts.

Embodiments of the present invention comprise forming the transitional silicon oxynitride layer by exposing the deposited stressed silicon nitride layer to an oxygen-containing atmosphere, such as $N_2O$, at a temperature of about 350° C. to about 550° C., e.g., 400° C., to form the silicon oxynitride layer, as at a thickness of about 20 Å to about 40 Å. Subsequently, the silicon oxide interlayer dielectric is deposited filling the gaps between the gate electrodes, as by SACVD at a thickness of about 6,500 Å to about 7,500 Å. Advantageously, the formation of a transitional silicon oxynitride layer eliminates or substantially reduces the dependence of the thickness of the SACVD oxide layer on surface patterns.

Embodiments of the present invention include depositing the stressed silicon nitride liner, forming the silicon oxynitride layer and depositing the SACVD oxide layer in the same tool, thereby advantageously improving cycle time and simplifying processing.

An embodiment of the present invention is schematically illustrated in FIGS. 1 through 5. Adverting to FIG. 1, a layer of strained Si 11 is formed on a layer of Si—Ge 10. A plurality of gate electrodes 12 (one illustrated for simplicity) are formed over strained Si layer 11 with a gate dielectric layer 13 therebetween. Sidewall spacers are then formed comprising an L-shaped oxide 14, e.g., silicon oxide, and a nitride layer 15, e.g., silicon nitride, thereon. Source/drain regions 17 are then formed in strained Si layer 11 and metal silicide layers 18, such as nickel silicide, are formed on the upper surface of gate electrode 12 and on source/drain regions 17.

Figure 2:
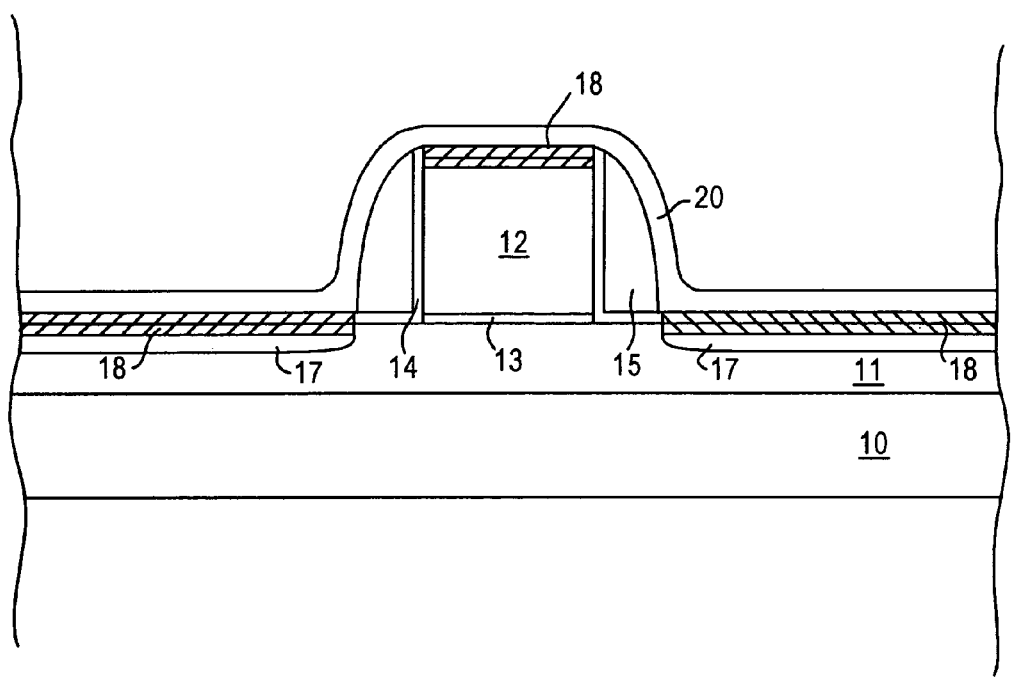
Figure 3:
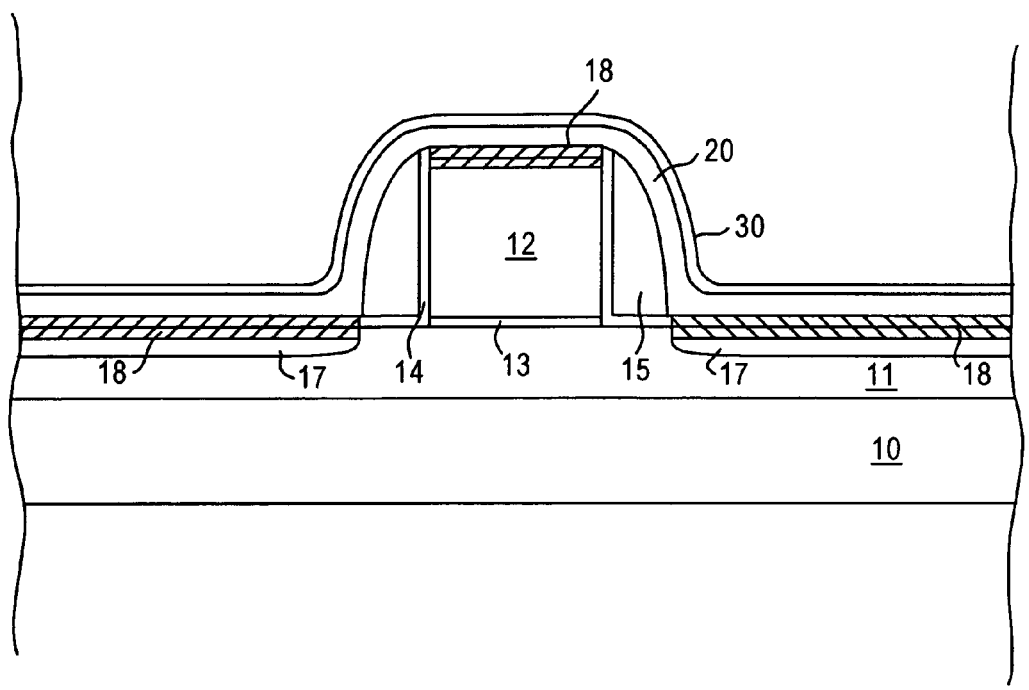

A stressed nitride liner 20 is then deposited on the nitride sidewall spacers 15 and on the metal silicide layers 18, as shown in FIG. 2. Adverting to FIG. 3, the stressed nitride liner 20 is deposited at a temperature of 400° C., in the presence of $N_2O$ plasma, thereby forming a transitional conformal silicon oxynitride layer 30 on stressed nitride layer 20.

Figure 4:
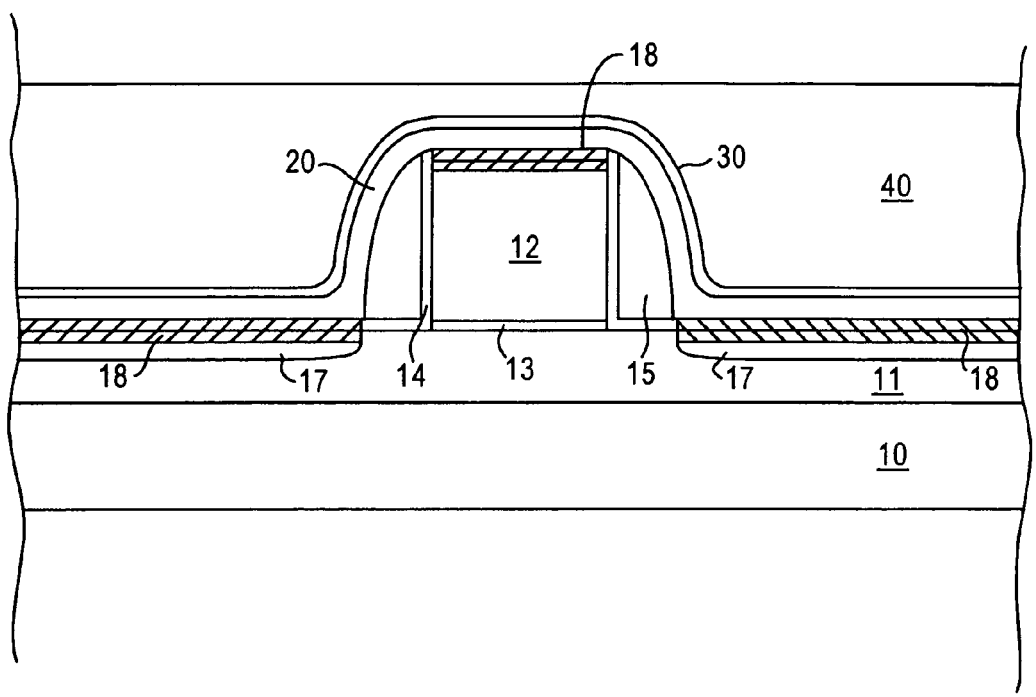

The presence of the transitional silicon oxynitride layer 30 enables deposition of a gap filling interlayer dielectric with greater uniformity without or with significantly reduced dependence on surface patterns. Dielectric layer 40 is then deposited filling gaps between the gate electrodes such as silicon oxide derived from TEOS by SACVD, as shown in FIG. 4. In other embodiments, the transitional silicon oxynitride layer 30 can be eliminated and layer 40 deposited directly on stressed nitride liner 20 by in-situ SACVD silicon oxide gap filling.

Figure 5:
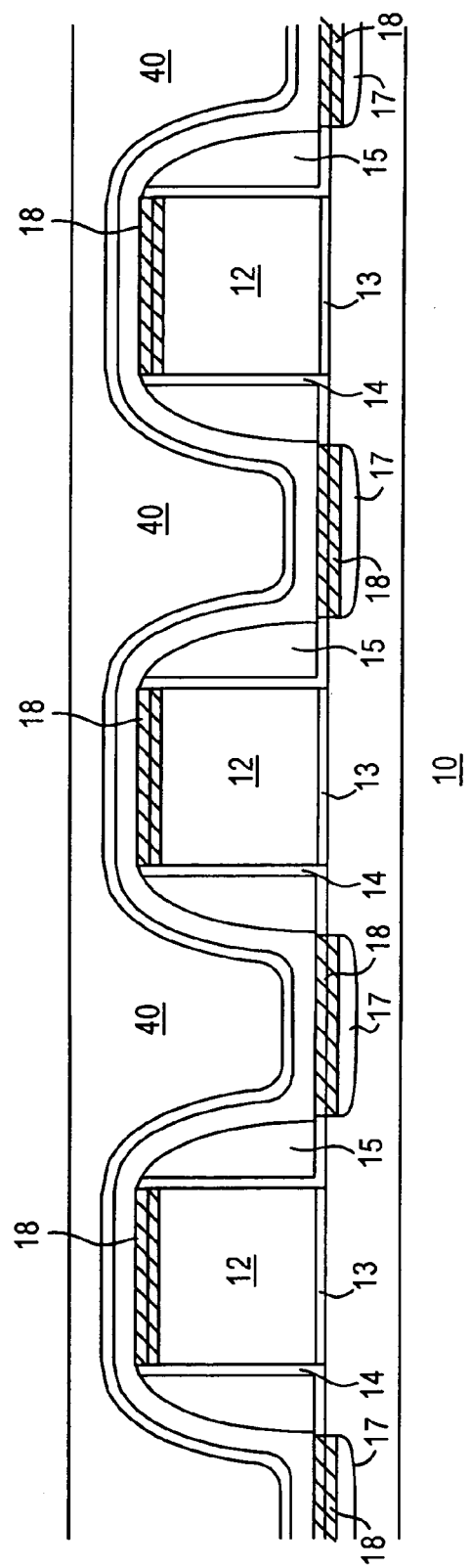

FIG. 5 schematically illustrates a structure with a plurality of gate electrodes 12 with the gaps therebetween filled with SACVD oxide 40. In FIGS. 1 through 5, similar features are denoted by like reference characters.

The present invention provides methodology enabling the fabrication of high quality, high operating speed semiconductor devices, including micro-miniaturized semiconductor devices based upon strained lattice technology with maximized transistor drive currents. The present invention also provides efficient methodology enabling the fabrication of semiconductor devices with greater accuracy by reducing the reverse loading effect when depositing gap filling SACVD oxides, thereby freeing the deposition of gap filling SACVD oxides from surface pattern sensitivity. The present invention also improves cycle time and simplifies manufacturing by providing methodology enabling the deposition of the stressed nitride layer, transitional silicon oxynitride layer and SACVD oxide in a single tool. The inventive methodology can be practiced utilizing conventional processing techniques and instrumentalities at rates consistent with the throughput requirements of automated fabrication techniques, and is fully compatible with conventional process flow for the manufacture of high-density integrated semiconductor devices.

The present invention enjoys industrial applicability in fabricating various types of semiconductor devices. The present invention enjoys particular industrial applicability in fabricating micro-miniaturized semiconductor devices with high operating speeds.

In the previous description, numerous specific details are set forth, such as specific materials, structures, reactants, processes, etc., in order to provide a better understanding of the present invention. However, the present invention can be practiced without resorting to the details specifically set forth. In other instances, well-known processing materials and techniques have not been described in detail in order not to unnecessarily obscure the present invention.

Only the preferred embodiment of the present invention and but a few examples of its versatility are shown and described in the present disclosure. It is to be understood that the present invention is capable of use in various other combinations and environments and is susceptible of changes or modifications within the scope of the inventive concept as expressed herein.

What is claimed is:

1. A semiconductor device comprising:
   a substrate;
   a plurality of transistors formed on the substrate, each transistor comprising source/drain regions and a gate electrode, having an upper and side surfaces, over the substrate with a gate dielectric layer therebetween, the gate electrodes being separated by a gap;
   a conformal stressed nitride liner over the upper and side surfaces of the gate electrodes and over the source/drain regions; and
   a dielectric layer over the transistors and filling the gaps between the gate electrodes.

2. The semiconductor device according to claim 1, further comprising a conformal silicon oxynitride layer on the stressed nitride liner, and the dielectric layer on the conformal silicon oxynitride layer filling the gaps.

3. The semiconductor device according to claim 1, wherein the substrate comprises a layer of silicon (Si) having a strained lattice on a layer of silicon-germanium (Si—Ge).

4. The semiconductor device according to claim 3, wherein:
   the transistor is a P-channel transistor; and
   the stressed nitride liner exhibits high compressive stress.

5. The semiconductor device according to claim 3, wherein:
   the transistor is an N-channel transistor; and
   the stressed nitride liner exhibits high tensile stress.

6. The semiconductor device according to claim 1, further comprising:
   dielectric sidewall spacers on side surfaces of the gate electrodes; and
   a layer of metal silicide on the upper surface of the gate electrodes and on the source/drain regions, wherein the stressed nitride liner is on the sidewall spacers and metal silicide layers.

7. The semiconductor device according to claim 6, wherein:
   the sidewall spacers comprise an oxide liner on the side surfaces of the gate electrode and on an upper surface portion of the substrate, and a nitride layer on the oxide liner.

8. The semiconductor device according to claim 1, wherein:
   the stressed nitride liner comprises silicon nitride and has a thickness of about 200 Å to about 1000 Å; and
   the silicon oxynitride layer has a thickness of about 20 Å to about 40 Å.

9. The semiconductor device according to claim 8, wherein the dielectric layer comprises silicon oxide and has a thickness of about 6,500 Å to about 7,500 Å.

* * * * *